United States Patent
Kuusisto

[11] Patent Number: 5,912,570
[45] Date of Patent: Jun. 15, 1999

[54] APPLICATION SPECIFIC INTEGRATED CIRCUIT (ASIC) HAVING IMPROVED RESET DEACTIVATION

[75] Inventor: Mika Kuusisto, Turku, Finland

[73] Assignee: Nokia Mobile Phones Limited, Salo, Finland

[21] Appl. No.: 08/779,811

[22] Filed: Jan. 8, 1997

[51] Int. Cl.$^6$ .............................. H03L 7/06; H03K 3/02
[52] U.S. Cl. .......................... 327/142; 327/143; 327/198
[58] Field of Search ................................. 327/142, 143, 327/198, 546; 455/550, 572, 574, 575

[56] References Cited

U.S. PATENT DOCUMENTS

| | | | |
|---|---|---|---|
| 5,323,066 | 6/1994 | Feddeler et al. | 327/12 |
| 5,461,649 | 10/1995 | Bailey et al. | 327/28 |
| 5,533,101 | 7/1996 | Miyagawa | 379/61 |
| 5,535,436 | 7/1996 | Yoshida et al. | 455/89 |
| 5,568,100 | 10/1996 | Locanthi | 331/74 |
| 5,691,659 | 11/1997 | Riley | 327/143 |

*Primary Examiner*—Timothy P. Callahan
*Assistant Examiner*—Hai L. Nguyen
*Attorney, Agent, or Firm*—Perman & Green, LLP

[57] ABSTRACT

Disclosed is a circuit and method for initializing clocked digital logic and for generating at least one clock signal for the clocked digital logic. The circuit includes at least one flip-flop that is responsive to a stimulus signal becoming active for asserting and then deasserting a reset signal to the clocked digital logic. The at least one flip-flop is clocked with a free-running clock signal. The circuit further includes a gating circuit for generating the at least one clock signal from the free running clock signal, and an edge detector that has an input coupled to the at least one flip-flop and an output coupled to the gating circuit. The edge detector operates to cause the gating circuit to place the at least one clock signal into an inactive state at least one period of the free running clock prior to the reset signal being deasserted, and for holding the at least one clock signal in the inactive state for at least one period of the free running clock subsequent to the reset signal being deasserted. In this manner it is guaranteed that no clock edges are applied to the clocked digital logic (e.g., flip-flops) for a predetermined period of time prior to and after the deassertion of the reset signal. The period of the free running clock signal is predetermined to exceed the minimum setup and hold times for the flip-flops that comprise the clocked digital logic.

15 Claims, 4 Drawing Sheets

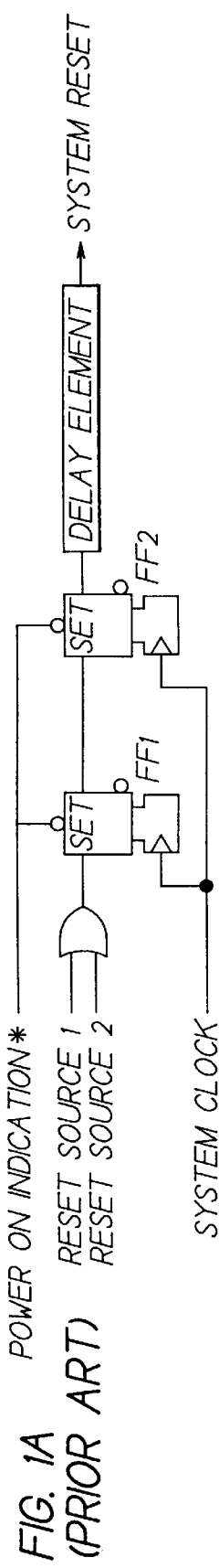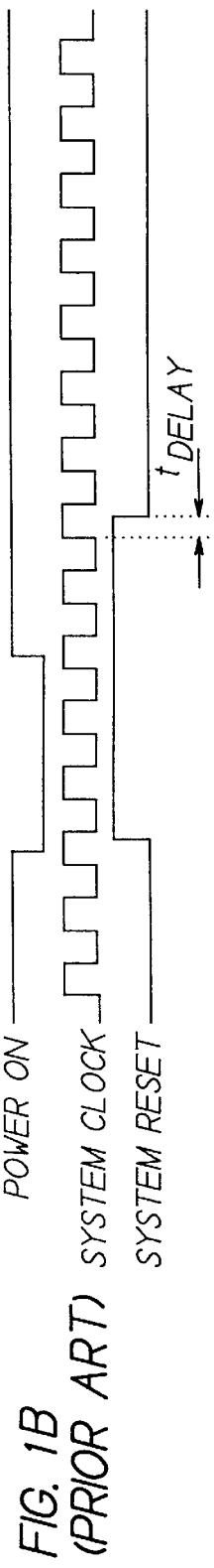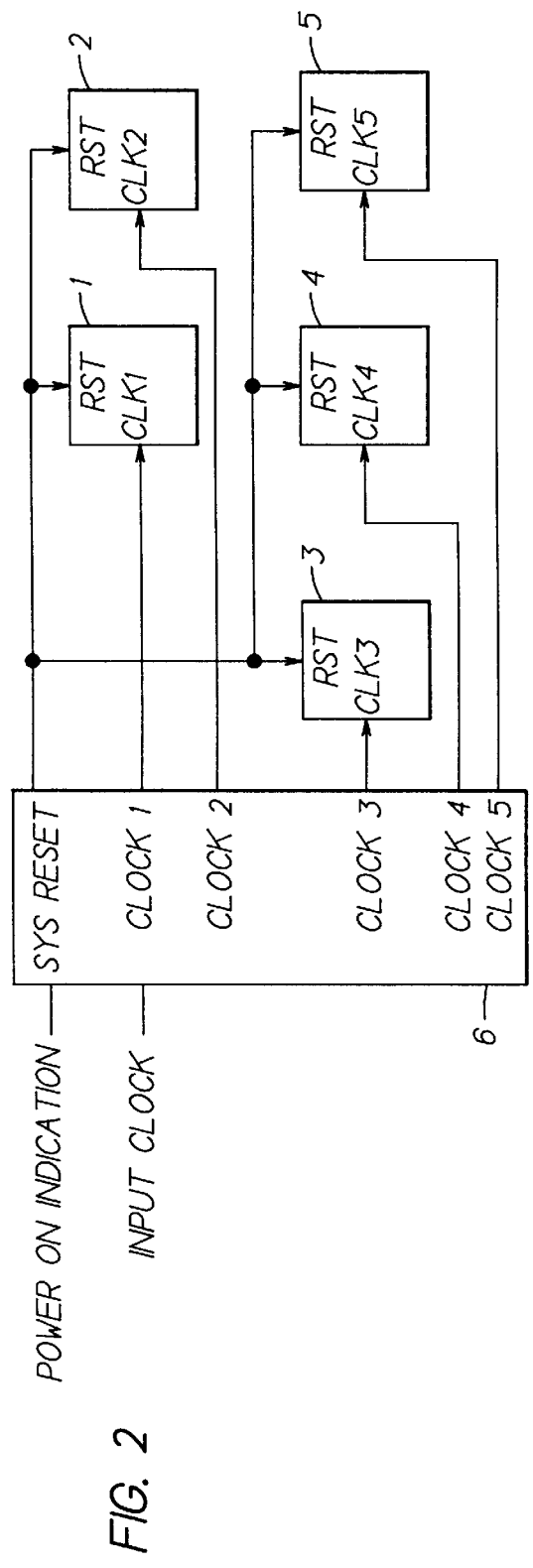
FIG. 1A (PRIOR ART)
FIG. 1B (PRIOR ART)
FIG. 2

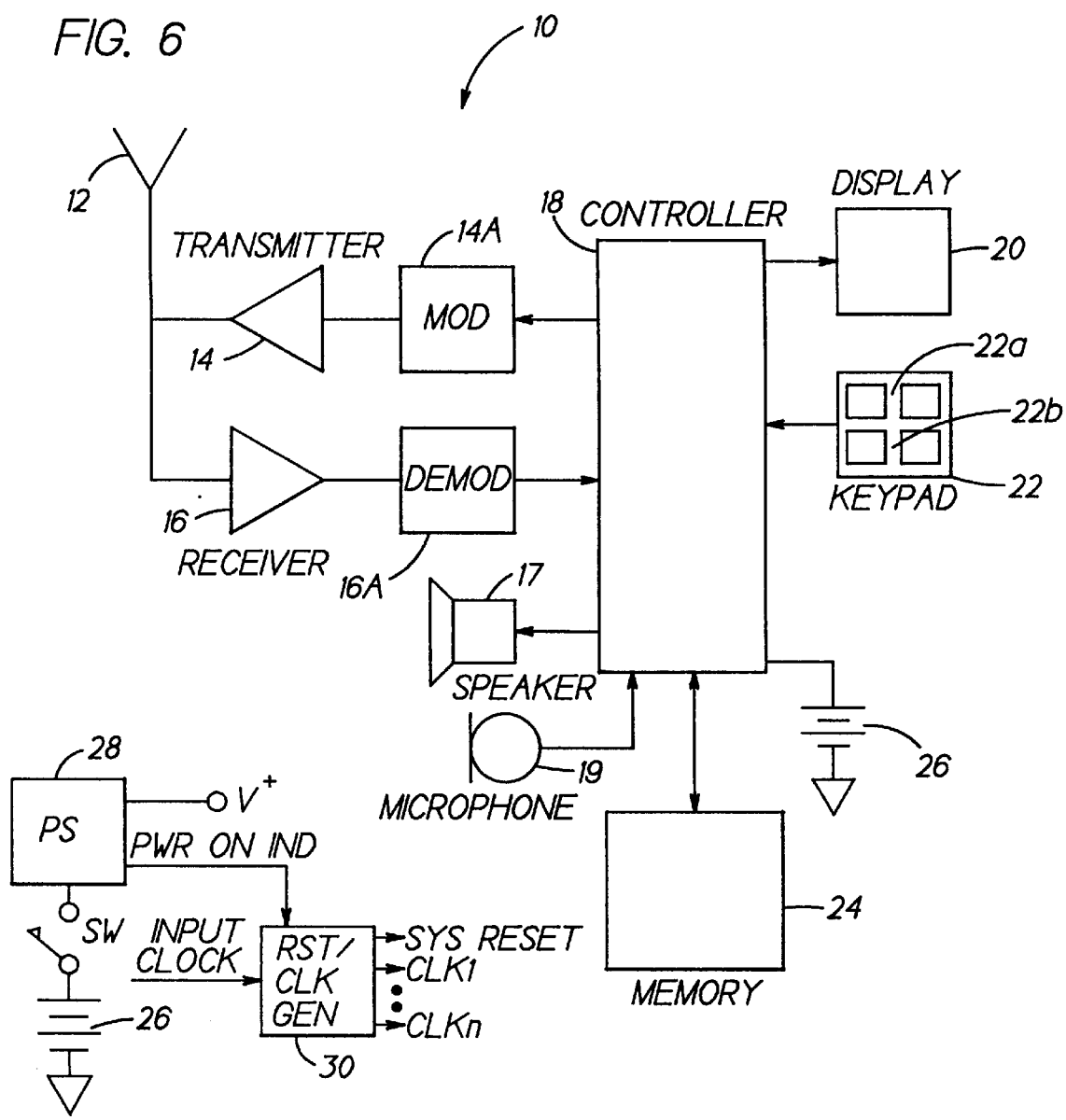

APPLICATION SPECIFIC INTEGRATED CIRCUIT (ASIC) HAVING IMPROVED RESET DEACTIVATION

FIELD OF THE INVENTION

This invention relates generally to clocked digital circuitry and, in particular, to application specific integrated circuits and other digital circuits used in, by example, cellular telephones, wherein a reset signal is applied for setting the circuit into a known state, and wherein the circuit is operated in conjunction with one or more clock signals.

BACKGROUND OF THE INVENTION

A digital application specific integrated circuit (ASIC) typically includes both combinational and sequential logic. The sequential logic (e.g., registers, state machines, etc.) is usually designed with flip-flops (FFs). When first powering up such a circuit, the default states of all the flip-flops need to be defined to set the ASIC into a known initialized state. Furthermore, this initialization must be accomplished in a consistent fashion each time the circuit is powered up. For example, finite state machines (FSM) need to be consistently reset to predefined start-up states, interrupt registers and mask registers need to be consistently initialized to correct states, etc.

A reset signal, often referred to as a system reset (SysReset) signal, is typically employed to initialize the logic. Normally, the SysReset signal is generated automatically when the ASIC or device that contains the ASIC is powered up. For example, when a cellular telephone is first powered on, the telephone's digital circuitry is reset and initialized to a known state. The SysReset can also be generated for other reasons so as to place the device into a default state. For example, many personal computers have a front panel reset button which, when depressed, causes the computer to re-initialize as though the power were switched off and then on again.

The SysReset can be applied to the flip-flops either synchronously or asynchronously. If an asynchronous reset is used, the SysReset is typically connected either to a reset (RST) input or to a preset (SET) input of each flip-flop. In each case there are setup and hold time requirements for the SysReset release timing, referenced to a rising edge of a clock (CLK) input of the flip-flop. The setup time for a flip-flop input defines a time window within which the input must be stable before the rising edge occurs at the flip-flop CLK input. Similarly, the hold time for a flip-flop input defines the time window during which the input must be stable after the rising edge has occurred at the flip-flop CLK input. The setup and hold time requirements vary according to the flip-flop type, flip-flop input, technology (e.g., CMOS vs. bipolar), etc., but typically the setup and hold time requirements are on the order of a few nanoseconds.

If the setup and hold time requirements are not fulfilled when deactivating the SysReset, it is possible that the flip-flop has not been initialized to the desired state. To prevent such an initialization failure, it is important that the SysReset not be released at about the same time that a rising edge occurs in the flip-flop's CLK input.

A traditional method to release the SysReset is to use a system clock rising edge (thus fulfilling the setup time requirement), and to add a delay element to delay the SysReset deactivation sufficiently to fulfil the hold time requirement.

FIG. 1A illustrates a conventional circuit using two flip-flops (FF1 and FF2) and a delay element to generate the SysReset signal from a stimulus signal such as a Power On Indication signal (typically generated by a power supply that powers the circuit), and to apply it asynchronously on and synchronously off. FIG. 1B illustrates the associated waveforms. The Power On Indication signal is assumed for this example to be active low (designated by the *).

This method is practical when the clock frequency is low, and where there are only a few clocks used in the design. In other words, this approach can be utilized when it is possible to find a time window in which to deactivate the SysReset, while still fulfilling the setup and hold time requirements of the flip-flops being initialized.

However, when the clock frequency is increased and when several clocks, including delayed clocks, are used in the design, the approach shown in FIGS. 1A and 1B is no longer reliable. This is because the rising edges of the various different clocks will occur at different times. For example, a clock skew caused by clock tree delays will introduce a temporal variation in the rising edges of the same clock occurring in different blocks of logic. In addition, if inverted and delayed clocks (created from the System Clock with delay elements) are used, there will be even more rising edges occurring in the time domain.

Depending on operating conditions, the best and worst case (min and max) clock delay values can vary considerably. As a result, it may simply be impossible to find a "clock edge free" time window that is sufficiently long to release the SysReset signal, while still fulfilling the setup and hold time requirements of all circuit flip-flops under all operating conditions.

Furthermore, and as is well appreciated by those skilled in the art, the use of delay elements is often undesirable, either because of excessive cost, if discrete delay element circuits are employed, or because of unreliability if the delays inherent in series coupled gates or buffers are employed.

OBJECTS OF THE INVENTION

It is a first object of this invention to provide an improved circuit and method that overcomes the foregoing and other problems.

It is a further object of this invention to provide a circuit and method for generating a system reset signal, and for generating one or more clock signals that are guaranteed to be free of transitions immediately before and after the system reset signal is deasserted.

SUMMARY OF THE INVENTION

The foregoing and other problems are overcome and the objects of the invention are realized by methods and apparatus in accordance with embodiments of this invention.

Disclosed herein is a circuit and method for initializing clocked digital logic and for generating at least one clock signal for the clocked digital logic. The circuit includes at least one flip-flop that is responsive to a stimulus signal becoming active for asserting and then deasserting a reset signal to the clocked digital logic. The at least one flip-flop is clocked with a free-running clock signal. The circuit further includes a gating circuit for generating the at least one clock signal from the free running clock signal, and an edge detector that has an input coupled to the at least one flip-flop and an output coupled to the gating circuit. The edge detector operates to cause the gating circuit to place the at least one clock signal into an inactive state at least one period of the free running clock prior to the reset signal being deasserted, and for holding the at least one clock signal in the inactive state for at least one period of the free running clock subsequent to the reset signal being deasserted.

In this manner it is guaranteed that no clock edges are applied to the clocked digital logic (e.g., flip-flops) for a predetermined period of time prior to and after the deassertion of the reset signal. The period of the free running clock signal is predetermined to exceed the minimum setup and hold times for the flip-flops that comprise the clocked digital logic.

BRIEF DESCRIPTION OF THE DRAWINGS

The above set forth and other features of the invention are made more apparent in the ensuing Detailed Description of the Invention when read in conjunction with the attached Drawings, wherein:

FIG. 1A is schematic diagram of a conventional circuit for generating a system reset (SysReset) signal;

FIG. 1B illustrates waveforms associated with the circuit of FIG. 1A;

FIG. 2 illustrates a typical SysReset and clock distribution scheme amongst a plurality of flip-flops, and is useful in explaining the circuit and method of this invention;

FIG. 6 is a block diagram of a wireless telephone, such as a cellular telephone, that includes the presently preferred embodiment of a circuit for generating the SysReset signal and also the SystemClock in accordance with FIGS. 4A and 4B.

DETAILED DESCRIPTION OF THE INVENTION

The inventor has realized that the solution to the problem explained previously is to create a time window of sufficient duration so as to eliminate any clock transitions when the system reset signal is deactivated or deasserted. That is, the inventor has solved the problem that arises when a circuit has so many temporally distributed clock edges that it is extremely difficult or impossible to find a time window of sufficient duration to release the SysReset. The problem is solved by generating a time window of sufficient duration such that the SysReset can be deactivated (deasserted), without violating the setup or hold time for any of the flip-flips that comprise the circuit being initialized. This invention can be utilized at both the printed circuit board level (with discrete logic circuits and packages), and also within an ASIC.

Before further describing the novel circuit and method of this invention, it will be useful to first discuss the circuit blocks shown in FIG. 2. More particularly, FIG. 2 shows circuit blocks 1–6 comprised of several ASICs and/or sub-blocks within a single ASIC. One of the ASICs (ASIC 6), or ASIC sub-blocks, includes circuitry dedicated to supplying clock signals to the other ASICs and also to creating the SysReset signal for all of the other circuit blocks. Each clock (Clock1–5) can be individually started and stopped by the controlling ASIC 6. The frequencies of the Clocks 1–5 are not limited to being the same, and inverted clocks may also be used, i.e., both edges of the clock signal are active.

When considering the Clock1–5 signals shown in FIG. 2, it should be realized that there are different delays in the clock lines, depending on the length of the trace conveying the clock signal, and the reactance and resistance associated with the trace. This causes a temporal variation in the arrival time of the clock edges, as seen from the Clk1–5 inputs of the ASICs 1–5, respectively. Certain of the clocks may also be intentionally delayed with respect to the others, such as by using a delay element.

Figure 3:
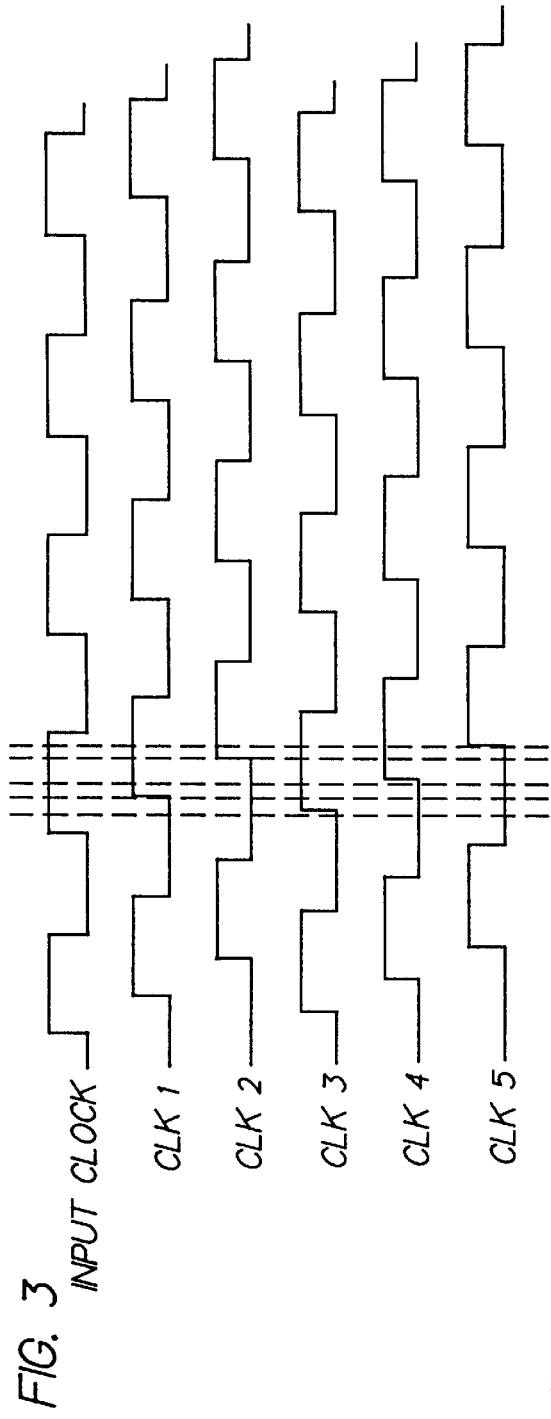
FIG. 3 illustrates waveforms that are exemplary of clock edge variations within an input clock cycle for the clock distribution scheme shown in FIG. 2.

FIG. 3 illustrates one example of the skew between the Clocks 1–5, seen from the ASIC Clk1–5 inputs, and referenced to the Input Clock (master clock signal) fed to the ASIC 6. The vertical lines in FIG. 3 indicate the critical time points within a clock cycle. That is, each vertical line indicates a position of a clock edge. When releasing SysReset signal the setup and hold time requirements of each of these clock edges must be satisfied, as it can be assumed that each of these clocks is applied to at least one flip-flop. As can be seen in FIG. 3, it is possible that the overall input clock cycle can be divided into several time "slices", and that the SysReset signal can thus be deactivated or released only within one of these slices. As can be appreciated, for high clock frequencies the width of a given slice can be quite narrow. Furthermore, due to variations in temperature, power supply output, and the like, the spacing between clock edges, and hence the width of each slice, may vary over time.

The method for SysReset deactivation in accordance with this invention removes the various clock edges shown in FIG. 3, and thus creates the required "safe" time window within which the SysReset signal can be released. One embodiment of circuitry for accomplishing this function is shown in FIG. 4A, and the corresponding timing diagram is illustrated in FIG. 4B.

Figure 4A:
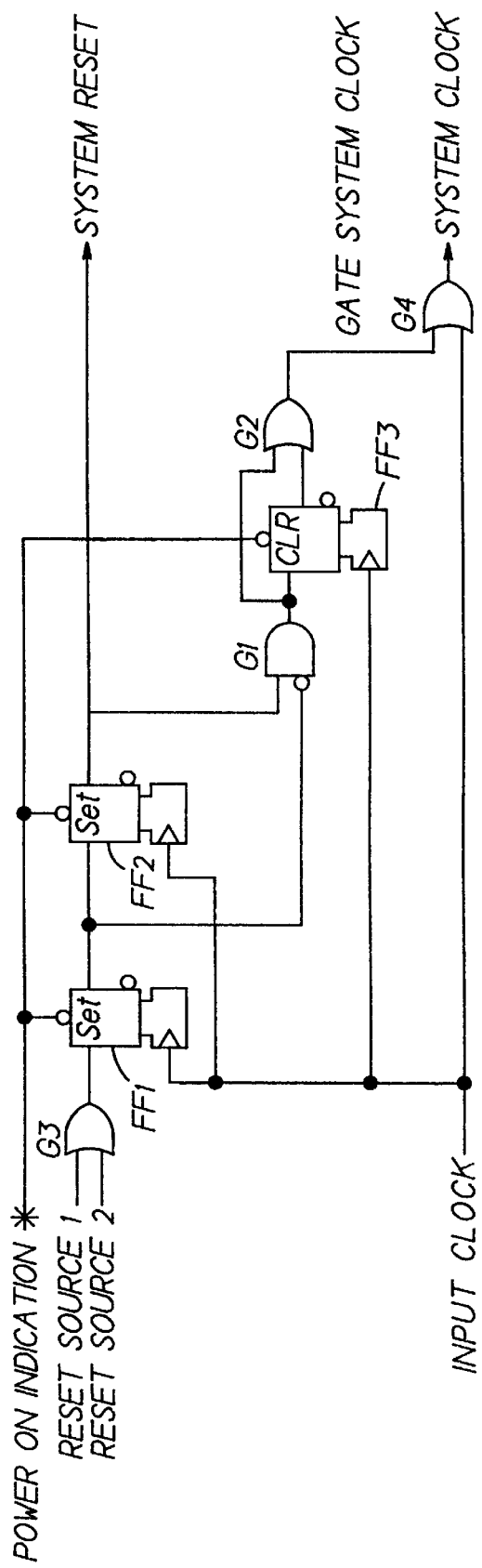
FIG. 4A is a schematic diagram of a presently preferred embodiment of a circuit for generating the SysReset signal (active high) and also the SystemClock.
Figure 4B:
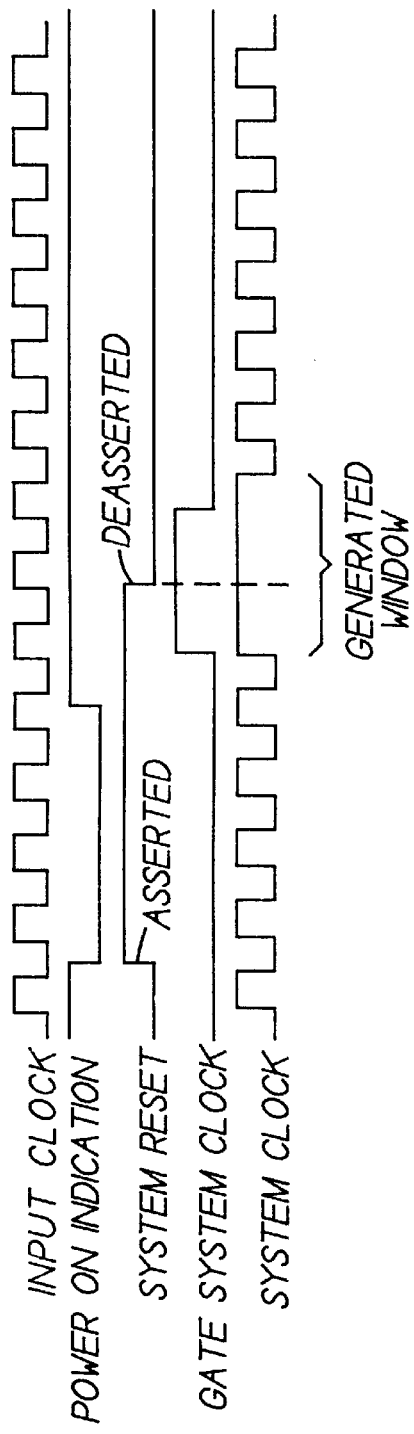
FIG. 4B illustrates waveforms associated with the circuit of FIG. 4A.

Referring now to FIGS. 4A and 4B, a free running ResetClk signal is used to clock three flip-flops (FF1–FF3), and is also used as a source clock, via OR gate G4, for the SystemClock signal. Flip-flops FF1–FF3 are connected to the Power On Indication signal as shown (i.e., FF1 and FF2 are preset, and FF3 is reset, by the Power On Indication signal). The SystemClock is used to generate all other required clocks (e.g., the Clocks 1–5 shown in FIG. 2). If only one clock signal were needed, then the SystemClock signal alone could be used. A falling edge detector (embodied in AND gate G1, OR gate G2, and FF3, connected as shown) is utilized to detect the time at which the SysReset signal is to be released or deasserted. When the SysReset signal release time is detected to be approaching, the GateSystemClock signal is set high for two SystemClock cycles, and is used to gate high (i.e., disable) the SystemClock while the SysReset is being released (i.e., brought low in this example). As can be seen in FIG. 4B, the GateSystemClock signal goes high on the rising edge of the ResetClk that precedes the next rising edge of the ResetClk that causes SysReset to go low, and stays high until the following rising edge of ResetClk. Since the SystemClock is gated high while the GateSystemClock signal is high, all clocks generated from the SystemClock (e.g., Clocks 1–5), excluding the free-running ResetClk, are also gated high (or low depending on the implementation). In this manner the required time window is created (corresponding to the time that the SystemClock is gated high), and it is thus ensured that no clock edge can occur during the time immediately preceding and following the time that the SysReset signal is deasserted. As a result, the setup and hold time requirements are fulfilled for all of the flip-flops fed from the generated clocks. This assumes, of course, that the period of the ResetClk signal is predetermined to exceed the minimum setup and hold times for the flip-flops of interest.

It should be noted that the FFs 1–3 used in the SysReset generation are directly initialized (set or cleared) using the asynchronous Power On Indication signal. The Power On Indication signal can be generated, by example, with a one-shot multivibrator that forms a part of the system power supply. The Power On Indication signal is typically generated when power is first applied, and may also be generated when power is removed, thereby insuring that the logic circuits are held in a reset state as the system power drops below the operating voltage range specified for the logic circuits.

Also shown in FIG. 4A are two (by example) further stimulus signals or reset source signals (Reset Source 1 and Reset Source 2), which are applied through an OR gate (G3) to the data (D) input of FF1. The Q output of FF1 is applied to the D input of FF2. For the timing diagram of FIG. 4B it is assumed that both Reset Source signals are low. If, during the operation of the circuit, one or both of the Reset Source signals is brought high (such as by depressing a suitably wired Reset switch, or by setting a bit in a register under program control), then the Q outputs of FF1 and FF2 will both go high, thereby asserting the SysReset signal (high). More or less than two Reset Source signals can be thus employed, depending on the system implementation.

Figure 5:
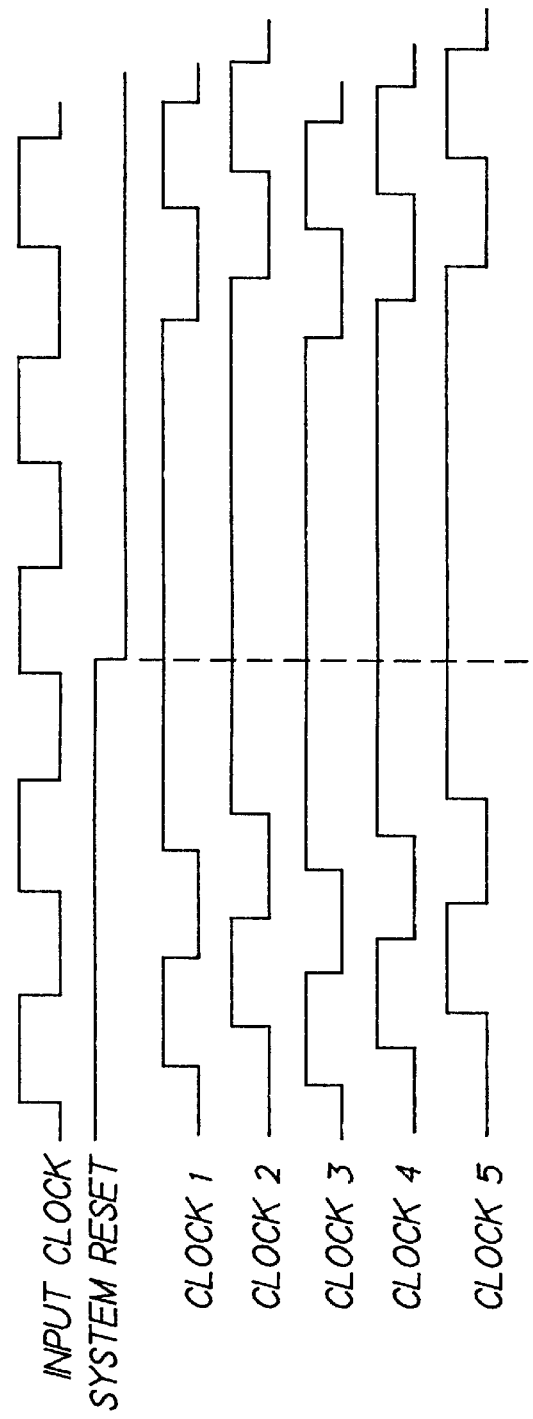
FIG. 5 illustrates waveforms that are exemplary of SysReset deactivation in accordance with this invention.

In FIG. 5 the timing diagram of FIG. 3 is modified to include the operation of the circuitry of FIG. 4A, and the SysReset deactivation method of this invention is thus demonstrated in the context described previously. It is clear that the numerous clock edges and associated time "slices" have been removed for a predetermined period of time, during which time the SysReset signal can be safely deactivated (i.e., deasserted after being previously asserted to institute the reset or initialization period).

Reference is made to FIG. 6 for illustrating a wireless user terminal or mobile station 10, such as but not limited to a cellular radiotelephone or a personal communicator, that is constructed to include the novel system reset and clock generation circuitry in accordance with this invention. The mobile station 10 includes an antenna 12 for transmitting signals to and for receiving signals from a base site or base station. The mobile station includes a modulator (MOD) 14A, a transmitter 14 and a receiver 16 (collectively referred to as a transceiver), a demodulator (DEMOD) 16A, and a controller 18 that provides signals to and receives signals from the transmitter 14 and receiver 16, respectively. These signals include signalling information in accordance with the air interface standard of the applicable cellular system, and also user speech and/or user generated data.

A user interface includes a conventional earphone or speaker 17, a conventional microphone 19, a display 20, and a user input device, typically a keypad 22, all of which are coupled to the controller 18. It is understood that the controller 18 includes the circuitry for implementing the audio and logic functions of the mobile station. The keypad 22 includes the conventional numeric (0–9) and related keys (#,*) 22a, and other keys 22b used for operating the mobile station 10. These other keys 22b may include, by example, a SEND key, various menu scrolling and soft keys, and a PWR key (represented schematically by a switch (SW)).

The mobile station 10 also includes various memories, shown collectively as the memory 24, wherein are stored a plurality of constants and variables that are used by the controller 18 during the operation of the mobile station. For example, the memory 24 stores the values of various cellular system parameters and the number assignment module (NAM). An operating program for controlling the operation of controller 18 is also stored in the memory 24 (typically in a ROM device). The memory 24 may also store received data, including user messages, prior to the display of the messages to the user. The mobile station 10 also includes a battery 26 for powering the various circuits that are required to operate the station.

One or more of the digital circuits that comprise these various components may be embodied within one or more ASICs.

The mobile station 10 can be a vehicle mounted or a handheld device, and can be capable of operating with one or more air interface standards, modulation types, and access types.

The mobile station includes a power supply circuit block 28, shown coupled to the battery 26 through the switch (SW), for generating various regulated DC voltages (shown generally as V+) and also the Power On Indication (PWRON IND) signal. The Power On Indication signal is pulsed low, as shown in FIG. 4B, after the switch (SW) is closed. The Power On Indication signal is coupled to a block of logic, designated as a RST/CLK Generator (GEN) 30, that implements the circuitry shown in FIG. 4A, and that has been described in detail above. The RST/CLK GEN 30, which may be embodied as a separate component or as a part of one or more ASICs that comprise the circuitry of the mobile station 10, generates and outputs the SysReset and, from a gated SystemClock (SysClk) signal, the various clocks (CLK1-CLKn) that are required by the various blocks of circuitry that comprise the mobile station 10. These signals are applied as required to the digital logic circuits that comprise the mobile station 10, and thus eliminate the occurrence of problems relating to an incorrect initialization of these logic circuits.

Although described in reference to the presently preferred mobile station embodiment, it should be realized that the teaching of this invention can be applied to a large number of different types of digital electronic equipment, including computers, facsimile machines, network switches, and the like, wherein it is required to correctly initialize the digital logic to a known state or states.

The SysReset deactivation method that has been described above offers several advantages over conventional techniques. First, the method is not dependent on circuit operating conditions, i.e., the SysReset deactivation is always identical despite variations in delays due to changes in temperature and supply voltage. Second, the method is not dependent on the clock frequency. Third, the method can be generally utilized in various types of multi-clock devices, wherein the different clocks are created from one common clock source. Fourth, the implementation is simple, and also avoids the use of a delay elements.

While described in the context of specific types of gates, flip-flops, logic levels, and the like, it should be appreciated that a number of variations to these embodiments can be made, while still achieving the same results.

Thus, while the invention has been particularly shown and described with respect to preferred embodiments thereof, it will be understood by those skilled in the art that changes in form and details may be made therein without departing from the scope and spirit of the invention.

What is claimed is:

1. A method for initializing clocked digital logic, comprising the steps of:

in response to a stimulus signal becoming active, asserting an initialization signal and applying the asserted initialization signal to the clocked digital logic;

during the time that the initialization signal is asserted, placing one or more clock signals into an inactive state to prevent an occurrence of rising or falling clock edges at inputs of the clocked digital logic;

deasserting the initialization signal; and placing the one or more clock signals into an active state so as to cause rising and falling clock edges at the inputs of the clocked digital logic.

2. A method as set forth in claim 1, wherein the step of deasserting occurs a first predetermined period of time after the step of placing the one or more clock signals into an inactive state and a second predetermined period of time before the step of placing the one or more clock signals into the active state, and wherein the first and second predetermined periods of time have a duration that is a function of setup and hold times of the clocked digital logic.

3. A method as set forth in claim 1, wherein the steps of placing and deasserting all occur in synchronism with a free-running clock signal, wherein the step of placing the one or more clock signals into an inactive state occurs at least one period of the free running clock prior to the step of deasserting, and wherein the step of placing the one or more clock signals into an active state occurs at least one period of the free running clock subsequent to the step of deasserting.

4. A method as set forth in claim 1, wherein the stimulus signal is generated by a power supply.

5. A method as set forth in claim 1, wherein the stimulus signal is generated in response to a manual or programmed reset command.

6. A circuit for initializing clocked digital logic and for generating at least one clock signal for the clocked digital logic, comprising:

at least two flip-flops that are responsive to a stimulus signal becoming active for asserting and then disasserting a reset signal to the clocked digital logic, said flip-flops being clocked with a free-running clock signal;

a gating circuit for generating the at least one clock signal from the free running clock signal; and an edge detector, having inputs coupled to said flip-flops and an output coupled to said gating circuit, for placing the at least one clock signal into an inactive state at least one period of the free running clock prior to said reset signal being deasserted, and for holding the at least one clock signal in the inactive state for at least one period of the free running clock subsequent to said reset signal being deasserted.

7. A wireless telephone, comprising:

a transceiver for transmitting and receiving RF signals conveying at least speech signals;

a controller coupled to said transceiver for controlling the operation of said transceiver, at least said controller comprising clocked digital logic, a power supply for powering said transceiver and said controller and for causing the generation of a stimulus signal; and a circuit for initializing said clocked digital logic and for generating at least one clock signal for said clocked digital logic, said circuit comprising at least two flip-flops that are responsive to said stimulus signal becoming active for asserting and then deasserting a reset signal to said clocked digital logic, said flip-flops being clocked with a free-running clock signal; a gating circuit for generating the at least one clock signal from the free running clock signal; and an edge detector, having inputs coupled to said flip-flops and an output coupled to said gating circuit, for placing the at least one clock signal into an inactive state at least one period of the free running clock prior to said reset signal being deasserted, and for holding the at least one clock signal in the inactive state for at least one period of the free running clock subsequent to said reset signal being deasserted.

8. A wireless telephone as set forth in claim 7, wherein at least a portion of said clocked digital logic is embodied within at least one application specific integrated circuit.

9. A method as set forth in claim 2, wherein the steps of placing and deasserting all occur in synchronism with a free-running clock signal, wherein the step of placing the one or more clock signals into an inactive state occurs at least one period of the free running clock prior to the step of deasserting, and wherein the step of placing the one or more clock signals into an active state occurs at least one period of the free running clock subsequent to the step of deasserting.

10. A method as set forth in claim 9, wherein the stimulus signal is generated by a power supply in response to a manual or programmed reset command.

11. A system for initializing clocked digital logic and for generating at least one clock signal for the clocked digital logic, comprising:

first circuit means responsive to a stimulus signal becoming active for asserting and then deasserting a reset signal to the clocked digital logic, said first circuit means being clocked with a free-running clock signal;

second circuit means for generating the at least one clock signal from the free running clock signal; and third circuit means, having inputs coupled to said first circuit means and an output coupled to said second circuit means, for placing the at least one clock signal into an inactive state at least one period of the free running clock prior to said reset signal being deasserted, and for holding the at least one clock signal in the inactive state for at least one period of the free running clock subsequent to said reset signal being deasserted.

12. The system as set forth in claim 11, wherein said first circuit means comprises at least two flip flop circuits, said second circuit means comprises a gating circuit, and said third circuit means comprises an edge detector circuit.

13. A radio unit including a transceiver for transmitting and receiving RF signals, a controller coupled to said transceiver for controlling the operation of said transceiver, at least said controller comprising clocked digital logic, a power supply for powering said transceiver and said controller and for causing the generation of a stimulus signal, said radio unit further comprising:

a circuit for initializing said clocked digital logic and for generating at least one clock signal for said clocked digital logic, said circuit comprising at least two flip-flops that are responsive to said stimulus signal becoming active for asserting and then deasserting a reset signal to said clocked digital logic, said flip-flops being clocked with a free-running clock signal;

a gating circuit for generating the at least one clock signal from the free running clock signal; and an edge detector, having inputs coupled to said flip-flops and an output coupled to said gating circuit, for placing the at least one clock signal into an inactive state at least one period of the free running clock prior to said reset signal being deasserted, and for holding the at least one clock signal in the inactive state for at least one period of the free running clock subsequent to said reset signal being deasserted.

14. The radio unit as set forth in claim 13 wherein said radio unit is a cellular telephone.

15. The radio unit as set forth in claim 14 wherein said RF signals comprise at least speech signals.

* * * * *